(12) United States Patent
Li

(10) Patent No.: US 7,733,163 B1
(45) Date of Patent: Jun. 8, 2010

(54) BIAS CURRENT COMPENSATION DEVICE AND METHOD

(75) Inventor: Kan Li, Singapore (SG)

(73) Assignee: Marvell International Ltd., Hamilton (BM)

( * ) Notice: Subject to any disclaimer, the term of this patent is extended or adjusted under 35 U.S.C. 154(b) by 259 days.

(21) Appl. No.: 11/931,508

(22) Filed: Oct. 31, 2007

Related U.S. Application Data

(60) Provisional application No. 60/864,041, filed on Nov. 2, 2006.

(51) Int. Cl.
*G05F 1/10* (2006.01)
(52) U.S. Cl. .................. 327/540; 327/538; 323/314
(58) Field of Classification Search .......... None
See application file for complete search history.

(56) References Cited

U.S. PATENT DOCUMENTS

| | | | | |
|---|---|---|---|---|
| 6,294,947 B1 * | 9/2001 | Gabara | .................. | 327/403 |
| 6,351,110 B1 * | 2/2002 | Pappalardo et al. | .......... | 323/285 |
| 7,427,873 B2 * | 9/2008 | Bingel et al. | .................. | 326/33 |
| 7,511,563 B2 * | 3/2009 | Botker et al. | ................. | 327/536 |

\* cited by examiner

*Primary Examiner*—Lincoln Donovan
*Assistant Examiner*—Terry L Englund

(57) ABSTRACT

A compensation device that can include a bias-able device, a bias circuit that provides the bias-able device with a bias current, a signal conditioner selectively coupled to the bias-able device, and an emulator. The signal conditioner and emulator can divert current from the bias-able device in an operational and calibration mode, respectively. In calibration mode, the emulator generates a compensation current that is combined with a sense current so that the sense current equals the bias current.

48 Claims, 3 Drawing Sheets

| 305 | 310 | 320 | 330 | 340 |
|---|---|---|---|---|
| PRE-CALIBRATION BIAS-POINT | CALIBRATION BIAS-POINT | OFFSET CURRENT | $I_{SENSED}$ RESULT | POST CALIBRATION BIAS-POINT |
| $D_{PRE-CAL}$ | $D_{CAL}$ | $I_{OFFSET}$ | $I_{SENSED}$ | $D_{POST-CAL}$ |

BIAS CURRENT COMPENSATION DEVICE AND METHOD

INCORPORATION BY REFERENCE

This application claims the benefit of U.S. Provisional Application No. 60/864,041, "Way to Subtract Away the Error from Reader Amplifier When Doing MR Current Bias Calibration" filed on Nov. 2, 2006, including all cited references which are hereby incorporated herein by reference in their entirety.

CROSS-REFERENCE TO RELATED APPLICATIONS

Cross-reference is made to the following co-pending and commonly assigned U.S. patent application: 11/931,422, "Bias Setting Device". The entire disclosure of the above-identified co-pending Application is hereby incorporated herein by reference in its entirety.

BACKGROUND

Electronic components are often operated or tested at a given condition despite intrinsic component variability. Also, the variability itself may be of interest, such as when one measures a component property like resistance or capacitance. Because a measurement device can perturb the electronic component being measured, the measurements can include error.

Measurement errors can confound efforts to calibrate an electronic component. Calibration can be necessary because the initial condition or operating state of the component may be unknown. Calibration can include 1) comparing an unknown to a standard instrument or reference, then 2) making an adjustment or a correction based on the comparison. In the case of electronic components, the comparison can be between a test bias condition and a reference bias condition and the adjustment can be a change of the test bias level to set a final bias level.

The comparison and adjustment steps in a calibration procedure can start with an initial comparison and repeat until a calibration completion criterion is satisfied. Because the initial comparison outcome and the electronic component's response to an adjustment are unknown, the calibration procedure may need to search for a bias condition that satisfies the calibration completion criterion.

SUMMARY OF THE DISCLOSURE

A compensation device can include a bias-able device and a bias circuit that provides the bias-able device with a bias current. The bias current can be a sense current less a first current. The compensation device can further include a signal conditioner, selectively coupled to the bias-able device that, when in an operational mode, is coupled to the bias-able device and diverts the first current from the bias-able device, and an emulator that is selectively coupled to the bias-able device that, when in a calibration mode, is coupled to the bias-able device and diverts the first current from the bias-able device. The emulator can generate a compensation current that can be combined with the sense current so that the sense current equals the bias current.

Further aspects of this disclosure can be directed at a variable resistance electrically coupled in series with the bias-able device. The variable resistance can change to adjust the bias current supply to the bias-able device and can decrease to adjust the bias current until the sense current substantially equals a predetermined current. The sense current can substantially equal the predetermined current when a voltage across a sense resistance substantially equals a reference voltage. A comparator can compare the voltage across the sense resistance with the reference voltage.

The compensation device can include a first variable resistance coupled in series to a first terminal of the bias-able device that can pass the sense current and the first current and a second variable resistance coupled in series to a second terminal of the bias-able device can pass a residual current less than the sense current. A state adjuster can monitor the sense current and can change the variable resistance to vary the bias current based on the sense current. The comparator can be coupled to the state adjuster and the comparator. The comparator can determine whether the sense current is substantially equal to a predetermined current when a voltage, caused by the sense current passing through a sense resistance, substantially equals a reference voltage.

The state adjuster can include a decoder that can receive a reference voltage and can generate an initial resistance of the variable resistance. The state adjuster can also include a counter that can decrease the resistance of the variable resistance from the initial resistance until the comparator determines that the sense current is substantially equal to a predetermined current. The counter can be coupled to the variable resistance and can control the variable resistance and thereby control the bias current passing through the bias-able device. The counter can decrease the resistance of the variable resistance from the initial resistance based on a clock signal. The variable resistance can include a first variable resistance, which can pass both the sense current and the first current, coupled in series to a first terminal of the bias-able device, and a second variable resistance, which can pass a residual current less than the sense current, coupled in series to a second terminal of the bias-able device.

In further aspects of this disclosure, a first offset current source can add a first offset current to the first current, so the compensation current can include both the first current and first offset current and a second offset current source can generate a second offset current, which can be substantially the same magnitude as the first offset current. The second offset current can be subtracted from the sense current and the compensation current to substantially cancel the first offset current. The second offset current source can be a current sink.

The compensation device can further include a first switch that can be open during operational mode to disconnect the emulator from the bias-able device, and can be closed during calibration mode to connect the emulator to the bias-able device and divert the first current from the signal conditioner to the emulator. In addition, a second switch can be closed during operational mode to connect the signal conditioner to the bias-able device, and can be open during calibration mode to disconnect the signal conditioner from the bias-able device and divert the first current from the emulator to the signal conditioner. In other words, the first and second switches can cooperate to direct the first current to the signal conditioner during operational mode and to the emulator during calibration mode. In addition, a third switch can be open during operational mode to disconnect an offset current source, and can be closed during calibration mode to connect the offset current source, thereby combining an offset current with the sense current. A switch controller can be coupled to the first, second, and third switches to open and close the switches appropriately in accordance with either an operational or calibration mode.

In further aspects of this disclosure, the signal conditioner can include a differential amplifier that can be coupled to the emulator to provide the emulator with a characteristic voltage of the differential amplifier. In the operational mode, the characteristic voltage can be an output node voltage that can be coupled to a feedback resistance through which the first current can pass. In the calibration mode, the characteristic voltage can be supplied to an equivalent resistance of the emulator through which the first current can pass. The resistance of the equivalent resistance of the emulator can be substantially equal to the resistance of the feedback resistance. In addition, the emulator can include an amplifier that is coupled to the emulator to provide the emulator with a characteristic voltage of the amplifier.

According to the disclosure, the bias-able device can be a magnetoresistor, a spin-valve, a photo-diode, a thermistor, and the like.

BRIEF DESCRIPTION OF THE DRAWINGS

The invention will be described with reference to the accompanying figures, wherein like numerals represent like elements, and wherein.

DETAILED DESCRIPTION OF EMBODIMENTS

Figure 1:
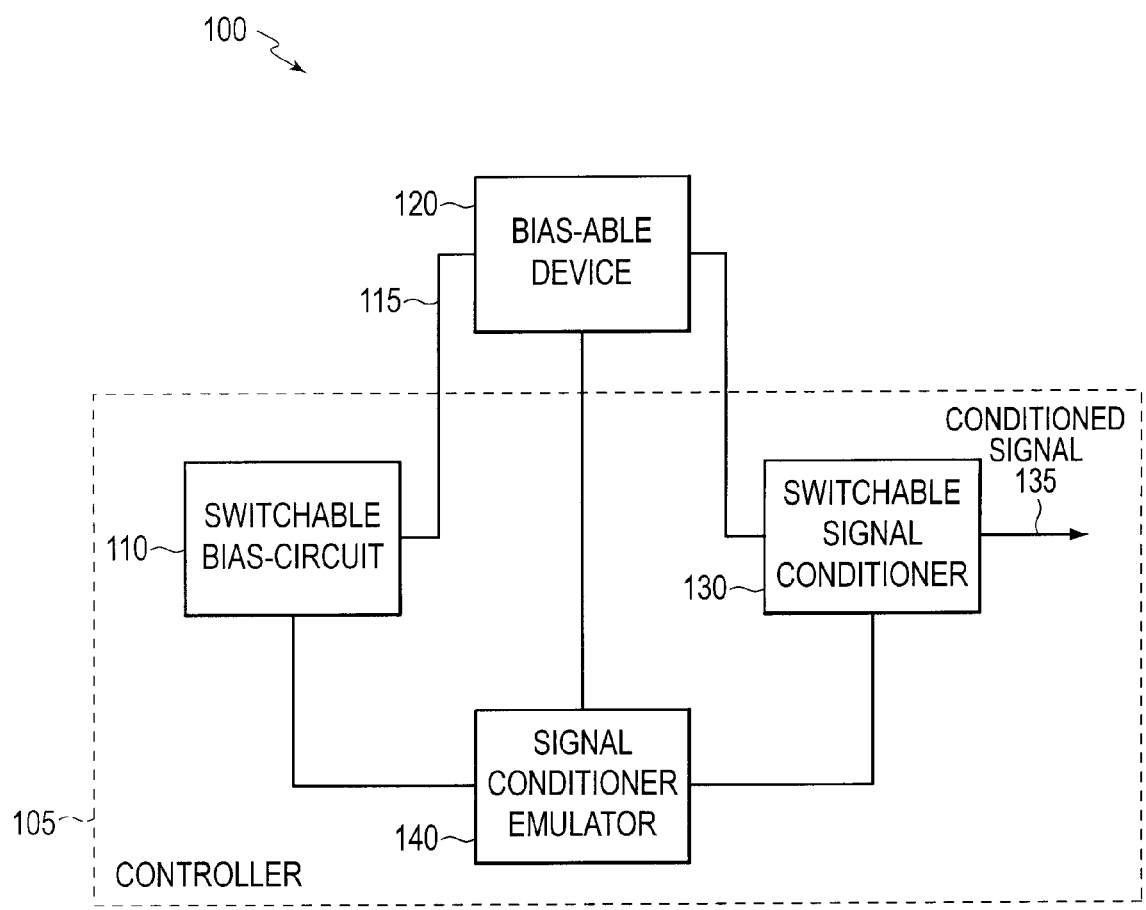
FIG. 1 is an exemplary diagram of the bias current compensation device and method.

FIG. 1 shows an exemplary diagram of an input bias current compensation device and method 100 that includes a switchable bias circuit 110, a bias-able device 120, a switchable signal conditioner 130, and a signal conditioner emulator 140. Each of the elements of the input bias current compensation device and a method 100 can be coupled as shown in FIG. 1.

The switchable bias circuit 110 can accept an input from signal conditioner emulator 140 and can set a bias current to bias-able device 120 and can output a sense signal 115. In an exemplary case, the bias current can be 1 mA. The signal conditioner emulator 140 can provide a compensation current to switchable bias circuit 110.

Bias-able device 120 may be set to a bias current and can emit or receive signals. The sensitivity, efficiency, gain, signal to noise ratio, noise temperature, reliability or any parameter of bias-able device 120 can be a function of input from switchable bias circuit 110. Bias-able device 120 can output a signal to switchable signal conditioner 130 and a signal to signal conditioner emulator 140. In an exemplary case, the signals to switchable signal conditioner 130 and to signal conditioner emulator 140 can be taken from the same terminal of bias-able device 120. In an exemplary case, both the sensitivity and reliability of bias-able device 120 are functions of input from switchable bias circuit 110.

Switchable signal conditioner 130 can accept a signal from bias-able device 120 and a signal from signal conditioner emulator 140. Switchable signal conditioner 130 can also send a signal to signal conditioner emulator 140 and can output a conditioned signal 135. The signal that switchable signal conditioner 130 can send to signal conditioner emulator 140 can determine the state of an internal variable of switchable signal conditioner 130. In an exemplary case, switchable signal conditioner 130 can send a signal that is linearly related to an input current. In other words, signal conditioner 130 can send a signal to signal conditioner emulator 140 that can determine the value of an unknown internal signal conditioner variable, which can cause error in the calibration of bias-able device 120.

The signal conditioner emulator 140 can accept a signal from switchable signal conditioner 130 and a signal from bias-able device 120 and can turn current sources on or off and can open or close switches in switchable bias circuit 110 and switchable signal conditioner 130. In an exemplary case, signal conditioner emulator 140 can turn on an offset current source and close a switch in switchable bias circuit 110 so the offset current is subtracted from switchable bias circuit 110 during calibration of bias-able device 120.

In an exemplary case, signal conditioner emulator 140 can switch out and thereby break an internal feedback path in switchable signal conditioner 130 and can switch in, and thereby divert an error current from bias-able device 120 that is approximately equal to the error current that would have flowed through an internal feedback path of switchable signal conditioner 130 in a normal, i.e., non-calibration, operational mode. In an exemplary case, during calibration signal conditioner emulator 140 can divert a bias current from switchable signal conditioner 130 to an internal measurement network that emulates the resistance and voltage of a read amplifier and can disable current diversion and emulation when the calibration mode is complete. In this exemplary case, signal conditioner emulator 140 can switch on a current source in switchable bias circuit 110 and can send a compensation current to switchable bias circuit 110.

The following paragraphs provide additional detail of the characteristics of the switchable bias circuit 100, the bias-able device 120, the switchable signal conditioner 130, and the signal conditioner emulator 140 elements of FIG. 1.

The switchable bias circuit 110 can be connected to signal conditioner emulator 140 and to bias-able device 120. In an exemplary case, switchable bias circuit 110 can be a switchable current source and a resistive ladder controlled by digital to analog converters (DACs).

A bias-able device 120 can be an electronic component that can require a particular bias current or operating condition prior to use or a standard bias condition for test and measurement.

Bias-able device 120 may be any component that can be set to a bias current prior to operation. Bias-able device 120 can, for example, be a sensor or a transducer. In an exemplary case, bias-able device 120 can be a magneto-resistive or spin-valve sensor or a photo-diode or a thermistor that is set to an bias current of approximately 1 mA. In an exemplary case, bias-able device 120 can be an emitter such as a light source, including a light emitting diode, a laser diode, a superluminescent diode, or an acoustic source, a heat source, an electromagnetic field source, a radio frequency source, and the like.

Interface or signal conditioning circuits can perturb the bias current of a bias-able device. An interface or signal conditioner perturbation can be an input offset current, an offset voltage, a startup-transient, a noise generator, and the like. In the case of a bias-able device that can operate at a constant current bias-point, the interface or signal conditioning or circuit may source or sink a bias current that is a substantial fraction of the desired bias-point current.

The switchable signal conditioner 130 can be connected to bias-able device 120 and signal conditioner emulator 140. The switchable signal conditioner 130 can be a group of active or passive components or any combination of active and passive components that include a switch. In an exemplary case, the switchable signal conditioner 130 can be a differential amplifier with a switchable DC feedback path.

The signal conditioner emulator 140 can be a group of active or passive components or a combination of active and passive components that accept and send signals. In an exemplary case, signal conditioner emulator 140 can be a buffer amplifier, a DC current source, an equivalent resistance, and a current mirror.

While the switchable bias circuit 110, the switching signal conditioner 130, and the signal conditioner emulator are shown as independent elements coupled to the bias-able device 120, they can also be incorporated into a controller 105. For example, the state adjuster 140 may be made part of the controller 105 employed by the bias setting device 100 and may be distributed throughout the bias setting device 100. Any configuration that permits monitoring and control of the bias setting device 100 can be used without departing from the spirit and scope of the present disclosure.

In an exemplary case, the bias current compensation device and method 100 can be included in a storage device, such as magnetic disk drive, an optical disk drive, and the like.

Figure 2:
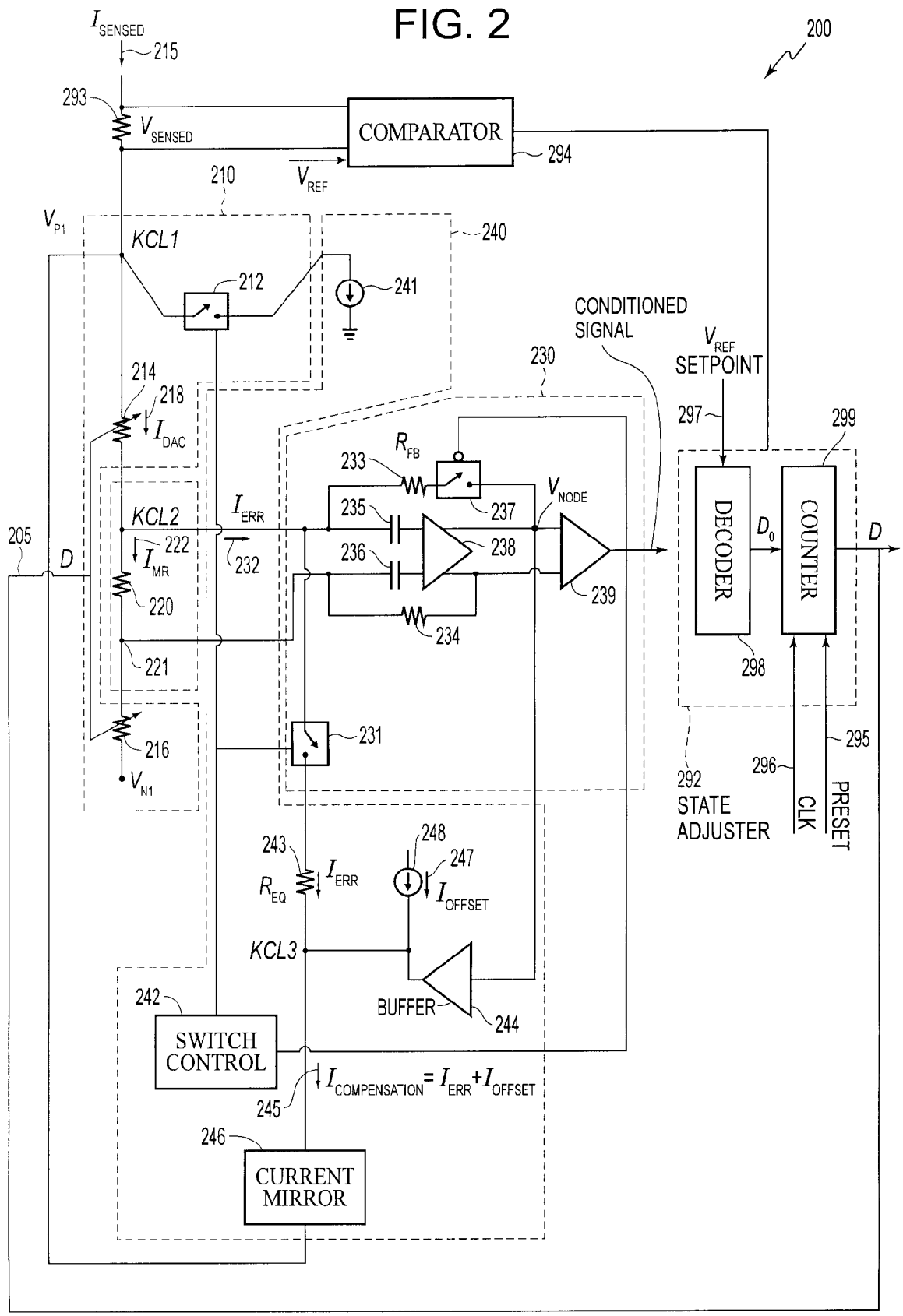
FIG. 2 is an exemplary detailed diagram of the bias current compensation device and method.

FIG. 2 shows an exemplary detailed diagram of an input bias current compensation device and method 200 including a switchable bias circuit 210, a bias-able device 220, a switchable signal conditioner 230, a signal conditioner emulator 240, a sense resistance 293, a comparator 294, and a state adjuster 292.

State adjuster 292 can contain a decoder 298 and a counter 299. State adjuster 292 can accept an inhibit signal from comparator 294, a setpoint 297 (Vref), a clock 296 and a preset 295. The overall structure and operation of elements of the input bias current compensation device and method 200 that correspond to similar elements of the input bias current compensation device and method 100 will be omitted for brevity.

The bias current compensation device and method 200 can have modes including: a first or pre-calibration mode, a second or calibration mode, and a third or post-calibration or operational mode. Both the pre-calibration and post-calibration modes may be called operating modes.

In the second mode (i.e., during calibration) of the input bias current compensation device and method 200, the signal conditioner emulator 240 can re-route a current from bias-able device 220 into the signal conditioner emulator rather than to the switchable bias network 210. The second, or calibration, mode of the input bias current compensation device and method 200 can be understood at a high level by applying Kirchhoff's current law (KCL) to three nodes. These three nodes can be called KCL nodes.

Consider the KCL1 node in switchable bias circuit 210. KCL1 can be held at a voltage $V_{P1}$. Two currents, $I_{SENSED}$ 215 and $I_{COMPENSATION}$ 245 can enter KCL1 and two currents, $I_{DAC}$ 218 and $I_{OFFSET}$ 247 can leave KCL1. Therefore, because charge carriers, such as electrons, do not accumulate at a node, the sum of currents leaving the node equals the sum of currents entering the node:

$$I_{SENSED} + I_{COMPENSATION} = I_{DAC} + I_{OFFSET} \quad (1).$$

In an exemplary case, the $I_{OFFSET}$ 247 current can be large enough to allow current mirrors to operate in their linear region.

Next, consider the KCL2 node at a junction of bias-able device 220 and signal conditioner 230. The current entering KCL2 can be $I_{DAC}$ 218 and the currents leaving KCL2 can be $I_{MR}$ 222 and $I_{ERR}$ 232. By current continuity:

$$I_{DAC} = I_{MR} + I_{ERR} \quad (2),$$

where equation (2) can be used to define $I_{ERR}$. It is to be appreciated that $I_{ERR}$ 232 can be a substantial fraction of $I_{MR}$ or can exceed $I_{MR}$. $I_{ERR}$ 232 can significantly change bias-able device 220's bias current from its desired bias current.

Next, consider a third node of interest, KCL3, which can be in signal conditioner emulator 240. During calibration, the $I_{ERR}$ 232 can be diverted to a monitoring network or emulator, such as the signal conditioner emulator 240. $I_{OFFSET}$ 247 can be added to $I_{ERR}$ 232 and a summed current ($I_{OFFSET}$ 247 + $I_{ERR}$ 232) can be supplied to KCL1. The summed current can be a denoted $I_{COMPENSATION}$ 245 and the compensation current can be taken from any point that can approximately implement this sum. The KCL current continuity requirement can yield the following equation at node KCL3:

$$I_{COMPENSATION} = I_{ERR} + I_{OFFSET} \quad (3).$$

Given these definitions, applications of Kirchhoff's current law, and the resulting equations (1), (2), and (3), the overall operation of the input bias current compensation device and method 200 during calibration of bias-able device 220 can be understood as follows: first, subtract $I_{COMPENSATION}$ from both sides of equation (1) to produce:

$$I_{SENSED} = I_{DAC} + I_{OFFSET} - I_{COMPENSATION} \quad (4).$$

Second, substitute the right side of equation (2) and the right side of equation (3) for $I_{DAC}$ and $I_{COMPENSATION}$, respectively, into equation (4) to produce:

$$I_{SENSED} = I_{MR} \quad (5).$$

Accordingly, the current through bias-able device 220 may be known despite $I_{ERR}$ 232 by measuring $I_{SENSED}$.

Given the foregoing description, a detailed description of the structural and operational characteristics of the bias current compensation device and method 200 can now be understood.

The switchable bias circuit 210 can include a switch 212, a resistance 214, and a resistance 216. Switchable bias circuit 210 can have power supply terminals that can be connected to positive and negative voltages, $V_{P1}$ and $V_{N1}$, respectively. Resistance 214 can be connected to a positive voltage $V_{P1}$ and resistance 216 can be connected to a negative voltage $V_{N1}$. The resistance of resistance 214 and resistance 216 may be the net or effective resistance of an electrical network. In an exemplary case, resistance 214 and resistance 216 may be implemented with resistive ladders within one or more digital to analog converters (DACs).

In operation of switchable bias current 210, the resistance of resistance 214 and resistance 216 may be varied as a function of a digital control word, D from an externally provided bias-point 205. The control word D can contain any number of bits (binary digits) or it may be any symbol from a countable set. D can control the resistance of resistance 214 and resistance 216. In an exemplary case, D may increase or decrease the resistance of resistance 214 and resistance 216. In one embodiment, the value of resistances 214 and 216 both decrease when D is an unsigned 7 bit binary number and D increases from a low value of 0000000 to 1111111. In an exemplary case, D may be denoted D[6:0] and D may be taken as an unsigned binary word D[6:0].

Switch 212 may be closed to subtract an offset current $I_{OFFSET}$ 247 from node KCL1 when the input bias current compensation device and method 200 measures the input bias current of switchable signal conditioner 230. In normal operation of bias-able device 220, switch 212 may be open and $I_{SENSED}$ 215 can be adjusted by using bias-point 205 to control resistances 214 and 216 so $I_{MR}$ 222 is approximately 1 mA.

Switchable signal conditioner 230 can include a switch 231, feedback resistance 233, a feedback resistance 234, a capacitor 235, a capacitor 236, a switch 237, a differential amplifier 238, and a boost amplifier 239. In an exemplary case, the feedback resistances 233 and 234 are approximately equal and the capacitors 235 and 236 are approximately equal.

A first terminal of feedback resistance 233, one terminal of capacitor 235, and a first pole of switch 231 can be joined at a node into which $I_{ERR}$ 232 from node KCL2 can enter. A second terminal of feedback resistance 233 can be joined to a pole of switch 237 and a second pole of switch 237 can be connected to a first output of differential amplifier 238, which may be denoted $V_{NODE}$, and a first input to amplifier 239. A second terminal of capacitor 235 can be connected to a first input of differential amplifier 238. A throw of switch 237 can be connected to switch control 242 from signal conditioner emulator 240.

Node 221 from bias-able device 220 can be connected to a first terminal of feedback resistance 234 and a first terminal of capacitor 236. A second terminal of feedback resistance 234 can be connected to a second output of differential amplifier 238 and to a second input of amplifier 239.

In normal operation, switch 237 can be closed and the current $I_{ERR}$ 232 can flow from node KCL2 through feedback resistance 233 to the first output of differential amplifier 238, which is at a voltage $V_{NODE}$. During calibration, switch 231 can be closed and switch 237 can be open so a current $I_{ERR}$ 232, which is nearly equal to its value during normal operation, can flow through switch 231 to signal conditioner emulator 240. In an exemplary case, feedback resistance 233 may be approximately 3 kilo-ohms (kΩ), bias-able device 220, resistance 214 and resistance 216 can all be approximately 300 Å, $V_{NODE}$ can be approximately 1 volt, and $I_{ERR}$ can be approximately 1.2 mA. In this exemplary case, $I_{ERR}$ can a large error compared to a desired $I_{MR}$ value of 1 mA.

Signal conditioner emulator 240 can contain a current source 241, an equivalent resistance 243 ($R_{EQ}$), a current source 248, a buffer 244, a switch control 242, and a current mirror 246. In an exemplary case, these signal conditioner emulator 240 elements can be implemented with NMOS and PMOS transistors. In an exemplary case, equivalent resistance 243 can be approximately the same value as feedback resistance 233.

During calibration, current sources 241 and 248 can both be turned on and can both source or sink approximately the same amount of current. In other words, current sources 241 and 248 can sink or source approximately $I_{OFFSET}$ 247 during calibration. In an exemplary case, during calibration, current source 241 sinks a current of approximately $I_{OFFSET}$ 247 from node KCL1, which can regulated to a voltage $V_{P1}$, and current source 248 supplies a current of $I_{OFFSET}$ 247 to node KCL3, which is held at a voltage of approximately $V_{NODE}$ by buffer 244.

The following paragraph explains how signal conditioner emulator 240 emulates the input characteristics of switchable signal conditioner 230. In normal operation, a current of approximately $I_{ERR}$ 232 flows from KCL2 to the first output of differential amplifier 238. It may be desirable to have approximately the same current flow during calibration. Thus, during calibration, the signal from KCL2 to switchable signal conditioner 230 may be directed into an emulator that, with respect to resistances and voltages, acts like the electrical network the bias-able device 220 is connected to during normal operation. This emulator may be described as a Thevinin equivalent of a selected input of switchable signal conditioner 230. The Thevinin equivalent may be converted to a Norton equivalent which can serve equally well as an emulator. The selected input can receive a current $I_{ERR}$ 232 from bias-able device 220.

A Thevinin equivalent of the selected input may match the following parallel combination of two paths: 1) a path from node KCL2 to feedback resistance 233 through switch 237 (which is closed during normal operation) to both the first output of differential amplifier 238 and to a first input of amplifier 239, and 2) a path from KCL2 to capacitor 235 to the first input to differential amplifier 238. The second path may not be significant for DC bias calibration.

Equivalent resistance 243 and buffer 244 can provide a Thevinin equivalent of the selected input of switchable signal conditioner 230. In an exemplary case, equivalent resistance 243 has approximately the same value as feedback resistance 233 and the buffer 244 can have 1) approximately unity voltage gain, 2) high input resistance, and 3) low output resistance. When these three conditions are met, the voltage at KCL3 can approximately equal to $V_{NODE}$. In an exemplary case, equivalent resistance 243 and buffer 244 may have optimized parameters that more closely implement a Thevinin equivalent of switchable signal conditioner 230's normal operational mode as seen by KCL2. In other words, the non-ideal input and output resistance of differential amplifier 238, amplifier 239, and buffer 244 and may slightly modify the value of equivalent resistance 243 and gain of buffer 244 that provide the least change in $I_{ERR}$ 232 during calibration versus normal operation. It is to be appreciated that current sources, such as current source 248 and current mirror 246, have high resistances compared to both equivalent resistance 243 and the output resistance of buffer 244; this can prevent perturbations by either current source to the resistance or voltage at KCL3.

Switch control 242 can close switches 231 and 212 and open switch 237 during calibration. Switch control 242 can open switches 231 and 212 and close switch 237 during normal operation of the input bias current compensation device and method 200. Switch control 242 may output the switch controlling signals on one or more output lines. In an exemplary case, switch control 242 can control switches 231 and 212 with a single output line and switch 237 with a separate output line.

During calibration, the $I_{MR}$ 222 current through bias-able device 220 can be determined for a fixed bias-point 205 or for a range of bias points. This calibration mode can be applied immediately after startup of a system employing the input bias current compensation device and method 200.

In operation, state adjuster 292 can modify the state of bias circuit 210, and thereby increase or decrease the bias current through bias-able device 220.

Decoder 298 can be a logic element that accepts a setpoint 297 and an input from comparator 294 and outputs a starting point value, $D_0$, that is a function of either or both inputs. The functional relationship between the decoder 298 inputs and the starting point output can be predetermined. Decoder 298 can be a lookup table or a finite state machine. In an exemplary case, decoder 298 can be a lookup table that outputs starting point values based on previous comparator 294 and setpoint 297 values. In an exemplary case, for a given setpoint 297, decoder 298 can emit one value of symbol $D_0$ when the output of the comparator 294 is in one state, and another value when comparator 294 is in another state. In other words, in this exemplary case, comparator 294 can determine which starting point-to-decoder output map is applied by decoder 298 to counter 299. In an exemplary case, decoder 298 can double its starting point output when an output of comparator 294 is low.

Counter 299 can accept input $D_0$ from decoder 298, an inhibit signal from comparator 294, a clock 296, and a preset 295 and can output control word D to bias circuit 210.

In operation, counter 299 can be set to an initial count by preset 295 and the initial counter can be $D_0$ from decoder 298. Counter 299 can be clocked by clock 296 to increment or decrement a digital word D. In an exemplary case, two preset 295 pulses can occur before the clock 296 signal becomes active. $D_0$ can appear directly on control word D when preset 295 is asserted.

Counter 299 can respond to clock 296 by incrementing the counter state to the next state. In an exemplary case, if counter 299 reaches its maximum state, it can hold that state despite further signals from clock 296. In an exemplary case, D can start at a value equal to $D_0$ and increment by one state per pulse of clock 296 and represent the count value as unsigned binary on D.

Output control word D from counter 299 can present signals to variable resistance 214 and variable resistance 216 of bias circuit 210. In an exemplary case, the resistance of variable resistance 214 and the resistance of variable resistance 216 can be linearly related to the unsigned binary value of D. In an exemplary case, when D increases, the resistances of variable resistance 214 and variable resistance 216 can decrease.

It should be understood that any method for setting a bias signal could be used. For example, the techniques described in co-pending and commonly assigned U.S. patent application Ser. No. 11/931,422, "Bias Setting Device", that include biasing a bias-able device at an initial biasing level, increasing the initial bias level by a first amount when an intermediate threshold exceeds the bias-able device's bias level, and incrementing the increased initial bias level by a second amount, that is a fraction of the first amount, until the bias-able device's bias level equals a desired bias level can be used.

Figures 3, 4:
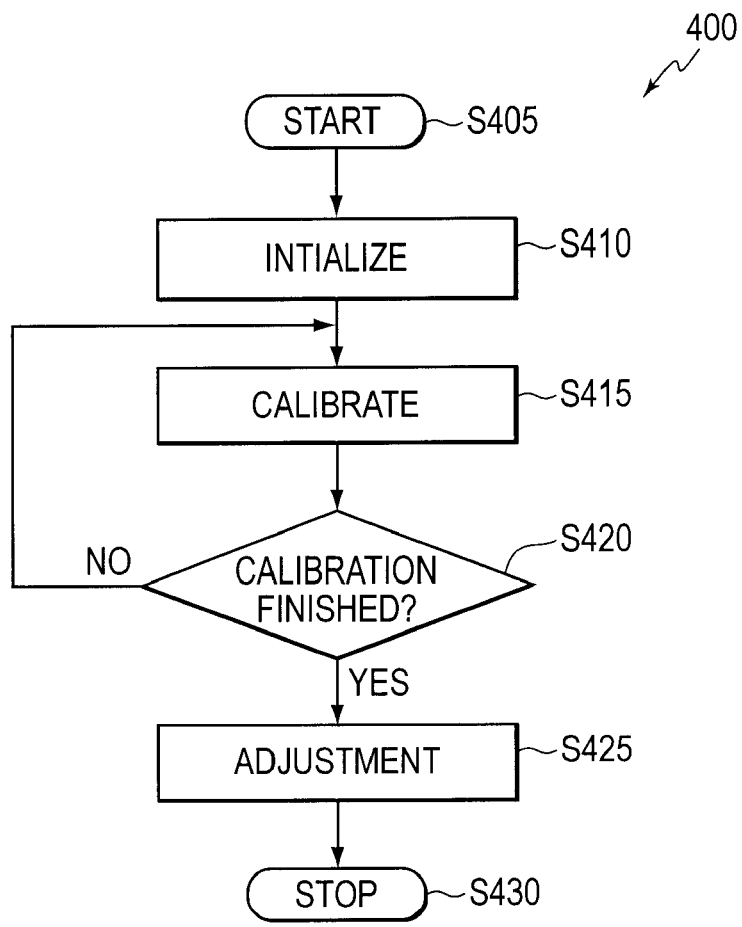
FIG. 3 is an exemplary data structure for the bias current compensation device and method.
FIG. 4 is an exemplary flowchart of the bias current compensation device and method.

FIG. 3 is an exemplary data structure 300 of the input bias current compensation device and method. Data structure can 300 include a pre-cal bias-point 305, a calibration bias-point 310, an offset current 320, an $I_{SENSED}$ result 330, and a post-cal bias-point 340. In an exemplary case, pre-cal bias-point 305, and offset current 320, can be scalars and calibration bias-point 310 and $I_{SENSED}$ result 330, can be vectors. In other words, a range of calibration bias-points can be tested and the $I_{SENSED}$ result for each tested bias-point can be stored.

Pre-cal bias-point 305 can include a value $D_{PRE-CAL}$ that is used to initialize the switchable bias circuit 210 prior to calibration. In an exemplary case, pre-cal bias-point 305 can be zero or a value that does not damage bias-able device 220.

Calibration bias-point 310 can include a scalar or vector value $D_{CAL}$ to initialize the switchable bias circuit 210 by bias-point 205 during calibration. In an exemplary case, calibration bias-point 310 can be a mid-scale value of a code word, a value that does not damage bias-able device 220, or a value that generates approximately 1 mA in bias-able device 220. In an exemplary case, calibration bias-point 310 can be a sequence of bias-points or a vector used to map the effect of different digital control words on the $I_{SENSED}$ result when switches 212 and 231 are closed and switch 237 is open.

Offset current 320 can include a value $I_{OFFSET}$ that sets the current of sources used in signal conditioner emulator 240 during calibration. In an exemplary case, offset current 320 can be a value that allows current sources 241 and 248 and current mirror 246 to operate in their linear input-output ranges.

$I_{SENSED}$ result 330 can include a scalar or vector $I_{SENSED}$ that holds a current approximately equal to a current of bias-able device 220 during calibration. $I_{SENSED}$ result 330 can be approximately equal to $I_{MR}$ 222 during calibration. In an exemplary case, $I_{SENSED}$ result 330 can be approximately 1 mA. In an exemplary case, $I_{SENSED}$ result can be $I_{SENSED}$ 215 during calibration. In an exemplary case, $I_{SENSED}$ result 330 can be a set of measurements resulting from a set of calibration bias-point 310. In other words, $I_{SENSED}$ 330 can quantify the functional relationship of bias-points to bias-able device currents.

Post-cal bias-point 340 can include a value $D_{POST-CAL}$. In an exemplary case, post-cal bias-point 340 can be a digital control word that is input to switchable bias circuit 210 from bias-point 205 during post-calibration operation.

For example, if an initial value of $D_{PRE-CAL}$ is 0, then the pre-calibration value of $I_{SENSED}$ might be 0.01 milliAmperes (mA). When the input bias current compensation device and method 100 enters calibration mode, the value of D can be changed to $D_{CAL}=60$ and the value of $I_{SENSED}$ may change to less than 1 mA, which can equal the current $I_{MR}$ through a magnetoresistor during calibration. If a calibration value of $I_{MR}=1.0$ mA is desired, then the input bias current compensation device and method 100 can, for example, increment D until $I_{SENSED}=1.00$ mA, then store the value $D_{POST-CAL}$ and adjust the magnetoresistor current to the calibrated value of 1.00 mA. In this example, the pre-calibration bias-point 305 can equal 0, the calibration bias-point 310 can equal 60, the offset current 320 can equal 0.5 mA, the $I_{SENSED}$ result 330 can equal 1.00 mA, and the post-calibration bias-point 340 can equal 64.

FIG. 4 is an exemplary flowchart of the bias current compensation method.

Flowchart 400 can begin at step S405 where the program can start. The program can proceed from step S405 to step S410 where a bias-point can be initialized. In an exemplary case, the pre-cal bias-point 305, $D_{PRE-CAL}$, may be supplied to switchable bias circuit 210 by bias-point 205.

After step S410, program flow can proceed to step S415 where calibration can be performed. In an exemplary case, calibration may include applying a calibration bias-point, enabling a current source, and measuring a current. In an exemplary case, a control word can be taken from calibration bias-point 310, an offset current can be taken from offset current 320 and used by current sources 241 and 248, and a value can be stored in $I_{SENSED}$ result 330. In an exemplary case, a sequence of calibration bias-points can be taken from calibration bias-point 310 and a sequence of $I_{SENSED}$ result 330 can be stored. In other words, $I_{SENSED}$ can be a function of $D_{CAL}$ and that function can be determined sequentially.

After step S415, program flow can proceed to S420 in which the completion of the calibration process can be assessed. If calibration is complete, the program can flow from S420 to S425; otherwise, program flow can proceed back to step S415. In an exemplary case, calibration can be deemed complete when the last element of a set of calibration bias-points 310 has been loaded into switchable bias circuit 210 and the results of the $I_{SENSED}$ measurements are stored in $I_{SENSED}$ result 330.

When program flow proceeds to step S425, a post-calibration operating bias-point adjustment can be made. In an exemplary case, a single value of $D_{POST-CAL}$ can be selected from post-calibration bias-point 340 and applied to bias-point 205. In an exemplary case, the relationship of $I_{SENSED}$ versus $D_{CAL}$ can be assessed from a polynomial regression of $D_{CAL}$ elements on $I_{SENSED}$ and a best-fitting value of $D_{CAL}$ can be selected that to closely approximate a desired value of $I_{SENSED}$. After step S425, program flow can proceed to step S430 where the process can end.

It will be appreciated that various of the above-disclosed and other features and functions, or alternatives thereof, may be desirably combined into may other different systems or applications. Also, various presently unforeseen or unanticipated alternatives, modifications, variations or improvements therein may be subsequently made by those skilled in the art, and are also intended to be encompassed by the following claims.

What is claimed is:

1. A compensation device, comprising:
    a bias-able device;
    a bias circuit that provides the bias-able device with a bias current, the bias current being a sense current less a first current;
    a signal conditioner selectively coupled to the bias-able device that, when in an operational mode, is coupled to the bias-able device and diverts the first current from the bias-able device; and
    an emulator that is selectively coupled to the bias-able device that, when in a calibration mode, is coupled to the bias-able device and diverts the first current from the bias-able device, the emulator generates a compensation current that is combined with the sense current so that the sense current equals the bias current.

2. The compensation device according to claim 1, wherein the bias circuit includes a variable resistance electrically coupled in series with the bias-able device.

3. The compensation device according to claim 2, wherein the variable resistance changes to adjust the bias current supply to the bias-able device.

4. The compensation device according to claim 3, wherein the variable resistance decreases to adjust the bias current until the sense current substantially equals a predetermined current.

5. The compensation device according to claim 4, wherein the sense current substantially equals the predetermined current when a voltage across a sense resistance substantially equals a reference voltage.

6. The compensation device according to claim 2, the variable resistance including:
    a first variable resistance coupled in series to a first terminal of the bias-able device that passes the sense current and the first current; and
    a second variable resistance coupled in series to a second terminal of the bias-able device that passes current less than the sense current.

7. The compensation device according to claim 1, further comprising:
    a variable resistance that is coupled in series with the bias-able device; and
    a state adjuster that monitors the sense current and changes the variable resistance to vary the bias current based on the sense current.

8. The compensation device according to claim 7, further comprising:
    a comparator that is coupled to the state adjuster, the comparator determines whether the sense current is substantially equal to a predetermined current.

9. The compensation device according to claim 8, wherein the sense current substantially equals the predetermined current when a voltage across a sense resistance caused by the sense current passing therethrough substantially equals a reference voltage.

10. The compensation device according to claim 7, wherein the state adjuster further comprises:
    a decoder that receives a reference voltage and controls generation of an initial resistance of the variable resistance; and
    a counter that decreases the resistance of the variable resistance from the initial resistance until a comparator determines that the sense current is substantially equal to a predetermined current.

11. The compensation device according to claim 10, wherein the counter is coupled to the variable resistance so as to control the variable resistance, and thereby control the bias current passing through the bias-able device.

12. The compensation device according to claim 7, the variable resistance including:
    a first variable resistance coupled in series to a first terminal of the bias-able device, the first variable resistance passes both the sense current and the first current; and
    a second variable resistance coupled in series to a second terminal of the bias-able device, the second variable resistance passes a residual current less than the sense current.

13. The compensation device according to claim 1, further comprising:
    a first offset current source that adds a first offset current to the first current, so that the compensation current includes both the first current and first offset current; and
    a second offset current source that generates a second offset current, the second offset current being substantially a same magnitude as the first offset current and being subtracted from the sense current and the compensation current so as to substantially cancel the first offset current.

14. The compensation device according to claim 1, further comprising:
    a first switch that is open during operational mode so as to disconnect the emulator from the bias-able device, and closed during calibration mode so as to connect the emulator to the bias-able device diverts the first current from the signal conditioner to the emulator; and
    a second switch that is closed during operational mode so as to connect the signal conditioner to the bias-able device, and open during calibration mode so as to disconnect the signal conditioner from the bias-able device.

15. The compensation device according to claim 14, wherein the first and second switches cooperate to direct the first current to the signal conditioner during operational mode and to the emulator during calibration mode.

16. The compensation device according to claim 14, further comprising a third switch that is open during operational mode to disconnect an offset current source, and closed during calibration mode to connect the offset current source, and thereby combine an offset current with the sense current.

17. The compensation device according to claim 16, further comprising:
    a switch controller that is coupled to the first, second, and third switches that is configured to open and close the switches appropriately in accordance with either the operational or calibration mode.

18. The compensation device according to claim 1, wherein the signal conditioner comprises:
    a differential amplifier that is coupled to the emulator to provide the emulator with a characteristic voltage of the differential amplifier.

19. The compensation device according to claim 18, wherein the characteristic voltage is an output node voltage that is coupled to a feedback resistance through which the first current passes in the operational mode.

20. The compensation device according to claim 19, wherein the characteristic voltage is supplied to an equivalent resistance of the emulator through which the first current passes in the calibration mode.

21. The compensation device according to claim 1, wherein the signal conditioner comprises:
an amplifier that is coupled to the emulator to provide the emulator with a characteristic voltage of the amplifier.

22. The compensation device according to claim 21, wherein the characteristic voltage is an output node voltage that is coupled to a feedback resistance through which the first current passes in the operational mode.

23. The compensation device according to claim 22, wherein the characteristic voltage is supplied to an equivalent resistance of the emulator through which the first current passes in the calibration mode.

24. The compensation device according to claim 23, wherein the resistance of the equivalent resistance of the emulator is substantially equal to the resistance of the feedback resistance.

25. The compensation device according to claim 1, wherein the bias-able device is at least one of a magnetoresistor, a spin-valve, a photo-diode, and a thermistor.

26. A compensation method, comprising:
biasing a bias-able device with a bias current, the bias current being a sense current less a first current;
in a calibration mode:
diverting the first current from the bias-able device to an emulator that emulates a signal conditioner;
generating a compensation current that is based on the first current; and
combining the compensation current with the sense current so that the sense current equals the bias current; and
in an operational mode:
diverting the first current from the bias-able device to the signal conditioner.

27. The compensation method according to claim 26, wherein the biasing the bias-able device further includes adjusting a variable resistance electrically coupled in series with the bias-able device.

28. The compensation method according to claim 27, wherein decreasing the variable resistance increases the bias current to the bias-able device.

29. The compensation method according to claim 28, decreasing the variable resistance to adjust the bias current until the sense current substantially equals a predetermined current.

30. The compensation method according to claim 29, wherein when a voltage across a sense resistance substantially equals a reference voltage, the bias current substantially equals the predetermined current.

31. The compensation method according to claim 27, wherein biasing the bias-able device includes:
coupling a first variable resistance in series to a first terminal of the bias-able device that passes the sense current and the first current; and
coupling a second variable resistance in series to a second terminal of the bias-able device that passes a residual current less than the sense current.

32. The compensation method according to claim 26, further comprising:
coupling a variable resistance in series with the bias-able device;
monitoring the sense current; and
adjusting the variable resistance to vary the bias current based on the sense current.

33. The compensation method according to claim 32, further comprising:
comparing whether the sense current is substantially equal to a predetermined current.

34. The compensation method according to claim 32, wherein the adjusting the variable resistance further comprises:
decoding a reference voltage and generating an initial resistance of the variable resistance based on the decoded reference voltage; and
clocking a counter that decreases the resistance of the variable resistance from the initial resistance until a comparator determines that the sense current is substantially equal to a predetermined current.

35. The compensation method according to claim 34, wherein clocking the counter adjusts the variable resistance, and thereby controls the bias current passing through the bias-able device.

36. The compensation method according to claim 35, wherein clocking the counter decreases the resistance of the variable resistance from the initial resistance.

37. The compensation method according to claim 32, wherein adjusting the variable resistance includes:
coupling a first variable resistance in series to a first terminal of the bias-able device, the first variable resistance passing both the sense current and the first current; and
coupling a second variable resistance in series to a second terminal of the bias-able device, the second variable resistance passing a residual current less than the sense current.

38. The compensation method according to claim 26, further comprising:
adding a first offset current to the first current, so that the compensation current includes both the first current and first offset current; and
generating a second offset current, the second offset current being substantially a same magnitude as the first offset current; and
subtracting the second offset current from the sense current and the compensation current so as to substantially cancel the first offset current.

39. The compensation method according to claim 38, wherein subtracting the second offset current diverts the second offset current from the sense current and the compensation current.

40. The compensation method according to claim 26, further comprising:
opening a first switch during operational mode so as to disconnect the emulator from the bias-able device;
closing the first switch during calibration mode so as to connect the emulator to the bias-able device diverts the first current from the signal conditioner to the emulator; and
closing a second switch during operational mode so as to connect the signal conditioner to the bias-able device; and
opening the second switch during calibration mode so as to disconnect the signal conditioner from the bias-able device.

41. The compensation method according to claim 40, wherein
  opening the first switch and closing the second switch directs the first current to the signal conditioner during operational mode; and
  closing the first switch and opening the second switch directs the first current to the emulator during calibration mode.

42. The compensation method according to claim 40, further comprising;
  opening a third switch during operational mode to disconnect a source of an offset current; and
  closing the third switch during calibration mode to connect the source of the offset current and thereby subtracting the offset current from the sense current and the compensation current.

43. The compensation method according to claim 26, further comprising:
  coupling a differential amplifier to the emulator to provide the emulator with a characteristic voltage of the differential amplifier.

44. The compensation method according to claim 43, wherein the characteristic voltage is an output node voltage that is coupled to a feedback resistance through which the first current passes in the operational mode.

45. The compensation method according to claim 44, wherein the characteristic voltage is supplied to an equivalent resistance of the emulator through which the first current passes in the calibration mode.

46. The compensation method according to claim 26, further comprising:
  coupling an amplifier to the emulator to provide the emulator with a characteristic voltage of the amplifier.

47. The compensation method according to claim 46, wherein the characteristic voltage is an output node voltage that is coupled to a feedback resistance through which the first current passes in the operational mode.

48. The compensation method according to claim 47, wherein the characteristic voltage is supplied to an equivalent resistance of the emulator through which the first current passes in the calibration mode.

* * * * *